(12) United States Patent
Kow et al.

(10) Patent No.: US 7,596,744 B1
(45) Date of Patent: Sep. 29, 2009

(54) AUTO RECOVERY FROM VOLATILE SOFT ERROR UPSETS (SEUS)

(75) Inventors: San-Ta Kow, San Jose, CA (US); Ann Wu, San Jose, CA (US); Tou Nou Thao, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 643 days.

(21) Appl. No.: 11/361,584

(22) Filed: Feb. 24, 2006

(51) Int. Cl.
*G06F 7/02* (2006.01)
*G01R 31/28* (2006.01)

(52) U.S. Cl. .................................................... 714/819

(58) Field of Classification Search ................ 714/724, 714/725, 758, 763, 799, 819; 365/189.04, 365/201
See application file for complete search history.

(56) References Cited

U.S. PATENT DOCUMENTS

| | | | |
|---|---|---|---|
| 4,142,243 A | 2/1979 | Bishop et al. | |
| 4,495,603 A | 1/1985 | Varshney | |
| 4,831,573 A | 5/1989 | Norman | |
| 5,349,670 A | 9/1994 | Agrawal et al. | |
| 5,574,855 A | 11/1996 | Rosich | |
| 5,583,450 A | 12/1996 | Trimberger et al. | |
| 5,650,734 A | 7/1997 | Chu et al. | |
| 5,705,938 A | 1/1998 | Kean | |
| 5,826,032 A | 10/1998 | Finn et al. | |
| 5,869,980 A | 2/1999 | Chu et al. | |
| 6,049,487 A | 4/2000 | Plants et al. | |
| 6,088,817 A | 7/2000 | Haulin | |
| 6,091,658 A | 7/2000 | McDonald et al. | |
| 6,237,124 B1 | 5/2001 | Plants | |
| 6,430,088 B1 | 8/2002 | Plants et al. | |
| 6,438,738 B1 | 8/2002 | Elayda | |
| 6,744,274 B1 | 6/2004 | Arnold et al. | |
| 6,874,107 B2 | 3/2005 | Lesea | |
| 7,036,059 B1 | 4/2006 | Carmichael | |
| 7,124,347 B2* | 10/2006 | Plants ........................ 714/763 |
| 7,167,404 B2* | 1/2007 | Pathak et al. ................ 365/201 |
| 7,434,123 B2* | 10/2008 | Ramos et al. ............... 714/724 |
| 2005/0071730 A1 | 3/2005 | Moyer et al. | |
| 2006/0007754 A1 | 1/2006 | Vernenker | |

* cited by examiner

*Primary Examiner*—Shelly A Chase
(74) *Attorney, Agent, or Firm*—Haynes and Boone, LLP

(57) ABSTRACT

In one embodiment, a programmable logic device for recovery from soft error upsets (SEUs) includes: a configuration memory operable to store configuration data; a configuration engine operable to configure the configuration memory; an error detection circuit operable to determine if the stored configuration data in the configuration memory has an error; and a configuration reset circuit operable to trigger the configuration engine to reconfigure the configuration memory if the error detection circuit detects the error.

14 Claims, 3 Drawing Sheets

AUTO RECOVERY FROM VOLATILE SOFT ERROR UPSETS (SEUS)

TECHNICAL FIELD

The present invention relates generally to soft error recovery and, more particularly, to the automatic recovery from soft error in volatile memories.

BACKGROUND

A user may configure a programmable logic device (PLD) such as a field programmable gate array (FPGA) or complex programmable logic device (CPLD) to perform a desired function and thus avoid having to design an application specific integrated circuit (ASIC) to perform the same task. Because designs and system requirements may change and evolve, users of programmable logic devices can simply reprogram these devices without having to engineer another ASIC. Although programmable logic devices thus offer users significant advantages, a concern may be raised concerning their configurability. Specifically, the configuration of programmable logic devices often depends upon a volatile configuration memory such as SRAM that may become corrupted during programmable logic device operation. Should a configuration bit in the configuration memory change its value, a programmable logic device may cease to perform the function desired by a user. In critical applications, such a failure could be disastrous.

Volatile configuration memory may become corrupted in a number of ways. For example, all materials, including the semiconductor substrate used to form a configuration memory, are naturally radioactive. Although this natural level of radioactivity is quite low, it still involves the emission of alpha particles. These high energy particles may then interact with a memory cell and corrupt its value. Alternatively, power brownout, i.e., a glitch or drop in supply voltages over a certain duration, may corrupt the programmed value of the memory cells. Cosmic rays also generate charged particles that may corrupt the programmed values. Because all these sources of memory error do not relate to internal hardware flaws in the memory cells but rather to external effects that cause errors, they may be denoted as sources of soft error. The error itself is also referred to as a "soft error upset" or "single event upset" (SEU).

Accordingly, there is need in the art for programmable logic devices configured to continuously monitor their configuration memories for soft errors.

SUMMARY

In accordance with an embodiment of the invention, a programmable logic device is provided that includes: a configuration memory operable to store configuration data; a configuration engine operable to configure the configuration memory; an error detection circuit operable to continually determine if the stored configuration data in the configuration memory has an error; and a configuration reset circuit operable to trigger the configuration engine to reconfigure the configuration memory if the error detection circuit detects the error.

In accordance with another aspect of the invention, a method is provided for recovering from a soft error within configuration data stored in a configured programmable logic device. The method includes the acts of: during operation of the configured programmable logic device, repeatedly processing the configuration data using an error-detection algorithm to generate a checksum; after a checksum is generated, comparing the generated checksum with a previously-generated checksum to determine if an error exists in the configuration data; and if an error is determined, initiating within the programmable logic device a reconfiguration of the configuration memory to remove the error from the configuration data.

In accordance with another aspect of the invention, a programmable logic device is provided that includes: a volatile configuration memory; and a configuration engine operable to reconfigure the volatile configuration memory during normal operation of the programmable logic device to correct for configuration data error.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
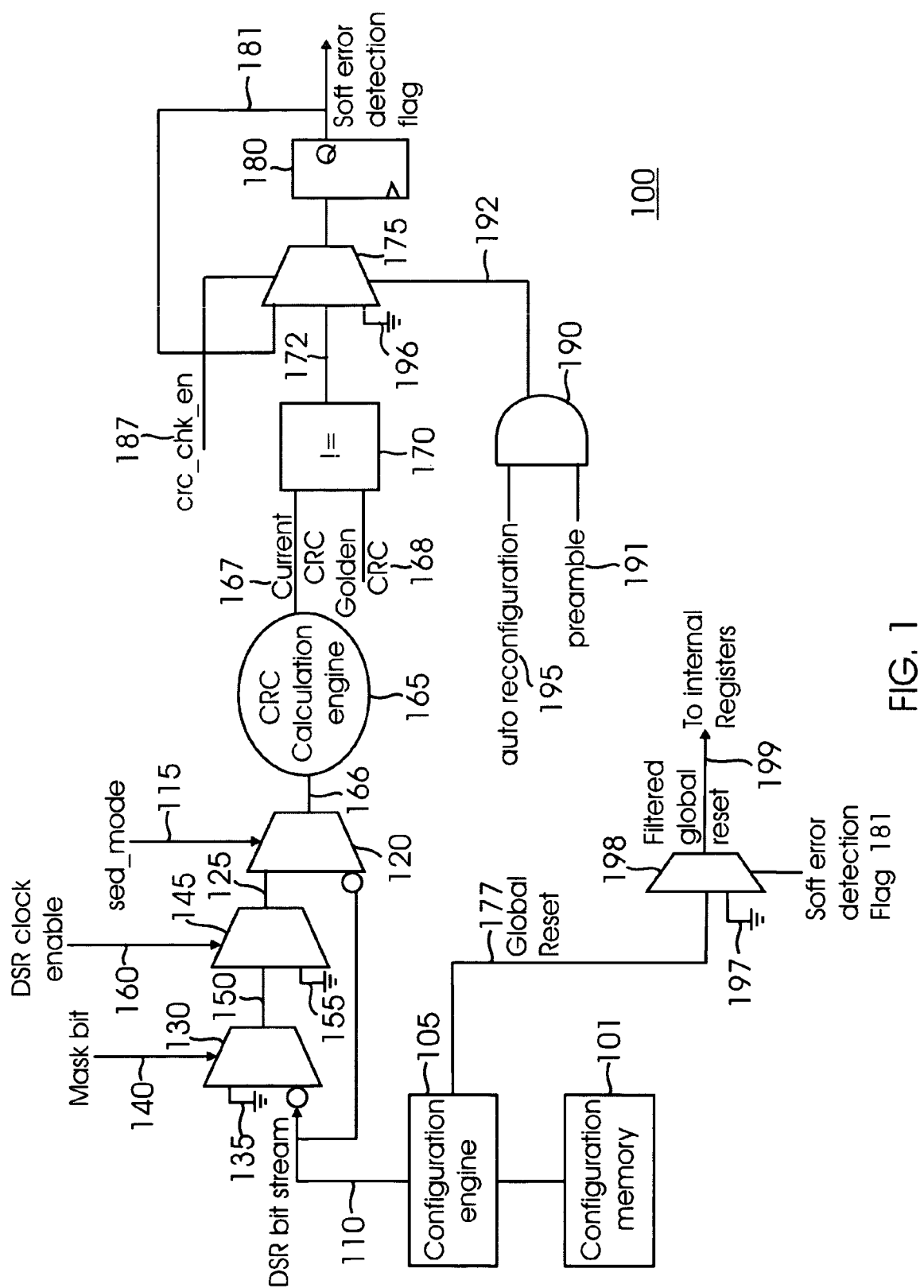
FIG. 1 is a circuit diagram of a soft error detection circuit in accordance with an embodiment of the invention.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

To address malfunctions caused by soft errors in volatile configuration memories, programmable logic devices are disclosed that continually verify the contents of their volatile configuration memories during normal operation. Should a soft error occur, the programmable logic device is operable to respond by reconfiguring its volatile configuration memory with the appropriate configuration bit stream. Advantageously, such reconfiguration may occur during normal operation of the programmable logic device.

A programmable logic device (PLD) may include an error detection circuit that verifies the integrity of its volatile configuration memory. This error detection circuit may comprise dedicated hardware or may comprise configured logic resources of the device. Regardless of whether the error detection circuit is implemented in dedicated hardware or through configured logic resources, this circuit operates to verify the integrity of the configuration memory.

Any suitable error detection algorithm may be used within the error detection circuit to verify the integrity of the stored configuration data, such as an algorithm that derives values from the configuration data. Preferably, the PLD uses the same algorithm used by the external programming tool to verify the configuration data during the configuration process. For example, the PLD and the programming tool may each use the same algorithm that calculates a checksum for the configuration data. As is known in the error detection arts, a checksum is a number that depends upon the data being examined. Should the contents of the data being error detected change, the checksum should also change. However, depending upon how robust the particular error detection algorithm being implemented is, the checksum may not change even though the data has become corrupted. For example, a simple parity bit checksum will not detect an error should just two bits in the original data change polarity. This type of undetected error condition is known as aliasing. More sophisticated error detection algorithms will generate a checksum that will change its value with high probability if the data has become corrupted. For example, a variety of cyclic redundancy check (CRC) algorithms will generate checksums (also denoted as frame check sequences) that are robust to aliasing. Accordingly, the following discussion will assume that a CRC error detection technique is implemented in the error detection logic. However, it will be appreciated that other types of error detection algorithms and techniques may be used, e.g., parity checks or linear feedback shift register techniques. During configuration, a programming tool will calculate a CRC checksum associated with the set of configuration data being loaded into the programmable logic device. As used herein, this initial CRC checksum will be referred to as the "golden" CRC.

Turning now to FIG. 1, an exemplary error detection circuit 100 is illustrated. As discussed previously, circuit 100 may be implemented using either dedicated hardware or through an appropriate configuration of the logic resources of the PLD (not illustrated) that incorporates the error detection circuit. Because configuration memory cells may be used as, for example, embedded random access memory (RAM) such that their contents may change during normal operation, configuration memory may be divided into two classes. The first class may be a read only memory (ROM) portion whose contents do not change during normal operation whereas the second class may be a RAM portion whose contents may change during normal operation.

A configuration engine 105 includes, for example, a data shift register (not illustrated) through which configuration data is loaded into and retrieved from a configuration memory 101 such as static RAM (SRAM). Thus, the configuration engine may retrieve the configuration data as a data shift register bit stream 110. The configuration engine may be enabled to mask those configuration memory cells used as RAM from contributing to the data shift register bit stream. For example, the data shift register bit stream contents applicable to such memory cells may simply be assigned to logical "zeroes." In this fashion, the ensuing CRC calculation is not perturbed by normal RAM operation.

A further classification may be made with regard to the ROM portion of the configuration memory. For example, because a programmable logic device such as a field programmable gate array (FPGA) must have the flexibility to accommodate a large spectrum of potential uses, any given configuration of an FPGA maps only to a certain percentage of its configuration memory. It is thus common for a given configuration to map to just 30% of the configuration SRAM resources of an FPGA. For such cases, the remaining 70% of the configuration memory is configured into a default, non-programmed state.

Efficiency may thus be gained by not verifying the non-programmed ROM portion of the configuration memory. To realize this efficiency, the error detection circuit may include a basic mode of operation and an advanced mode of operation. In the basic mode, all the contents of the ROM portion of the configuration memory are verified. However, in the advanced mode, only the programmed contents of the ROM portion of the configuration memory are verified. Referring again to FIG. 1, a signal sed_mode 115 controls a multiplexer (MUX) 120 responsive to which mode is implemented. In the basic mode, the sed_mode signal controls MUX 120 to select data shift register bit stream 110. However, in the advanced mode, the sed_mode signal controls MUX 120 to select for a filtered data shift register bit stream 125. Filtered data shift register bit stream 125 corresponds to the contents of the programmed configuration memory. To produce this filtered data shift register bit stream, a MUX 130 selects between the data shift register bit stream and a ground signal 135 responsive to a mask bit control signal 140. The mask bit control signal is asserted and ground signal 135 selected if the data shift register bit stream corresponds to the contents of non-programmed configuration memory. In this fashion, the non-programmed configuration memory contents are filtered out to produce the filtered data shift register bit stream. If the configuration engine is not active, data shift register bit stream 110 does not represent configuration memory contents. To filter out the possibility of processing mere noise (from an inactive configuration engine) a MUX 145 selects between an output 150 of MUX 140 and a ground signal 155 to provide the filtered data shift register bit stream to MUX 120. Because MUX 145 is controlled by a data shift register (DSR) clock enable signal 160, MUX 145 acts to null the filtered data shift register bit stream if the configuration engine is not active. Conversely, if DSR clock enable signal 160 is asserted because the configuration engine is active, MUX 145 selects for output 150. Since configuration data may be stored in an inverted form, both MUX 140 and 120 invert the data shift register bit stream so that the resulting CRC calculation is performed correctly. In embodiments in which the configuration data is not stored in an inverted form, inversion of the filtered and unfiltered data shift register bit stream would be unnecessary.

A CRC calculation engine 165 processes an output 166 of MUX 120 to generate a current CRC 167. The CRC calculation engine may comprise a linear feedback shift register (not illustrated) or other suitable CRC calculating circuit. The current CRC represents the current state of the configuration memory being verified. A comparator 170 compares the current CRC to a golden CRC 168 (the initial checksum). If the current CRC differs from the golden CRC, the comparator asserts an output 172. As used herein, a signal is denoted as "asserted" if it has a logical true state, regardless of whether that true state corresponds to an active high or active low state. A MUX 175 may select for output 172 so that this output may be registered in a register 180. A "Q" output of the register represents a soft error detection flag 181. The assertion of this flag indicates that the corresponding programmable logic device should reconfigure its configuration memory because the memory contents are corrupted by soft error. In this fashion, the CRC calculation engine monitors whether an error exists in the stored configuration data. Once the current CRC has been calculated, the soft error detection circuit may immediately begin another retrieval of the stored configuration data such that the monitoring is continual. In other embodiments, the soft error detection circuit may wait a predetermined or variable amount of time before again calculating the current CRC.

A user may not want the PLD to automatically reconfigure its configuration memory in response to the assertion of the soft error detection flag. Instead, the user may simply want to be signaled that a soft error has been detected. To keep the soft error detection flag asserted during this time so that an appropriate I/O signal (not illustrated) may signal the user, flag 181 is fed back to MUX 175. If no automatic reconfiguration is desired, a CRC check enable signal 187 controls MUX 175 to select for the flag so that the soft error detection flag is kept asserted until it is reset. MUX 175 is also controlled by an output 192 of an AND gate 190. AND gate 190 processes a preamble signal 191 and an auto reconfiguration signal 195. If both signal 191 and 195 are asserted, MUX 175 selects for a ground signal 196 such that the soft error detection flag is reset or de-asserted.

Figure 2:
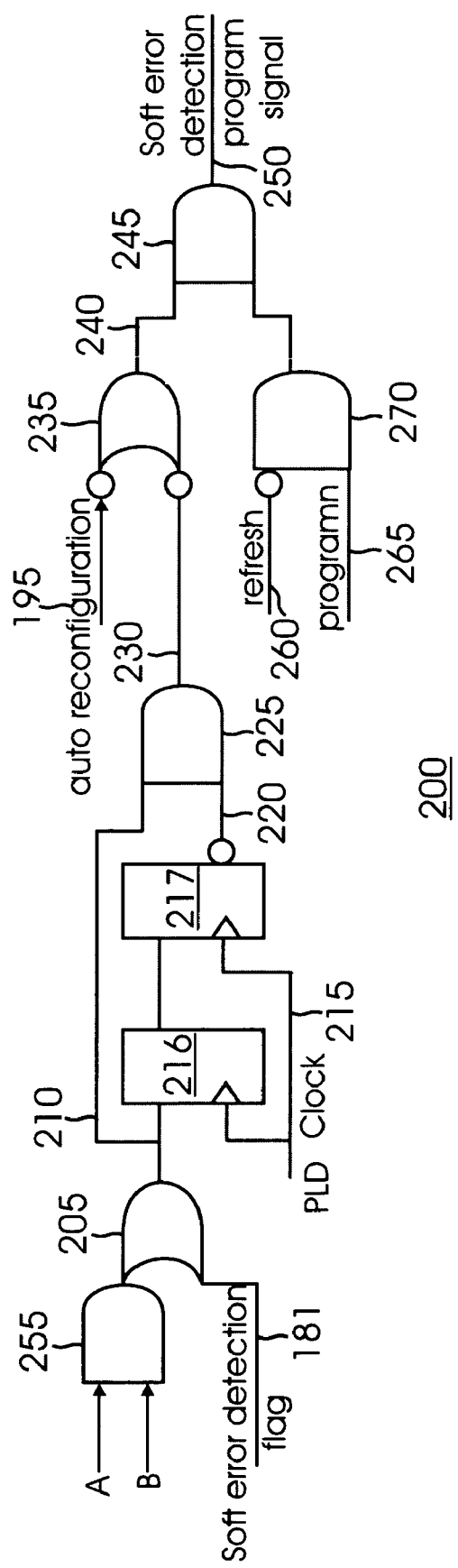
FIG. 2 is a circuit diagram of a configuration reset circuit in accordance with an embodiment of the invention.

Once the soft error detection flag is asserted, the PLD should respond by initiating a reconfiguration. An exemplary configuration reset circuit 200 is illustrated in FIG. 2 that is operable to initiate a reconfiguration of the PLD in response to an assertion of soft error detection flag 181. An OR gate 205 asserts an output 210 responsive to the assertion of the soft error detection flag. To prevent glitches, output 210 is delayed through two cycles of PLD clock 215 through serially-connected registers 216 and 217. An output 220 of register 217 is inverted and received by an AND gate 225 that also receives output 210. Thus, an output 230 of AND gate 225 will be pulled high in response to the assertion of the soft error detection flag. An OR gate 235 receives an inverted version of output 230. Thus, an output 240 of OR gate 235 will go low in response to the assertion of output 230. Because output 240 is received by an AND gate 245, a soft error detection program signal 250 provided by AND gate 245 will be pulled low. In this exemplary embodiment, soft error detection program signal 250 is an active low signal that initiates a reconfiguration of the PLD. It will be appreciated, however, that embodiments responding to an active high signal may also be implemented in accordance with the features described herein.

To enable testing modes, the configuration reset circuit may include an AND gate 255 that also drives OR gate 205. AND gate receives test signals A and B such that if both signals A and B are asserted, configuration reset circuit will pull soft error detection program signal low as described previously. In addition, a response to an assertion of soft error detection flag 181 may be obviated by pulling auto reconfiguration signal 195 low because an inverted form of the auto reconfiguration signal is also processed by OR gate 235. Additional testing may be performed through assertion of a refresh signal 260 and/or a program signal 265 received at an AND gate 270. An output of AND gate 270 also drives AND gate 245.

Figure 3:
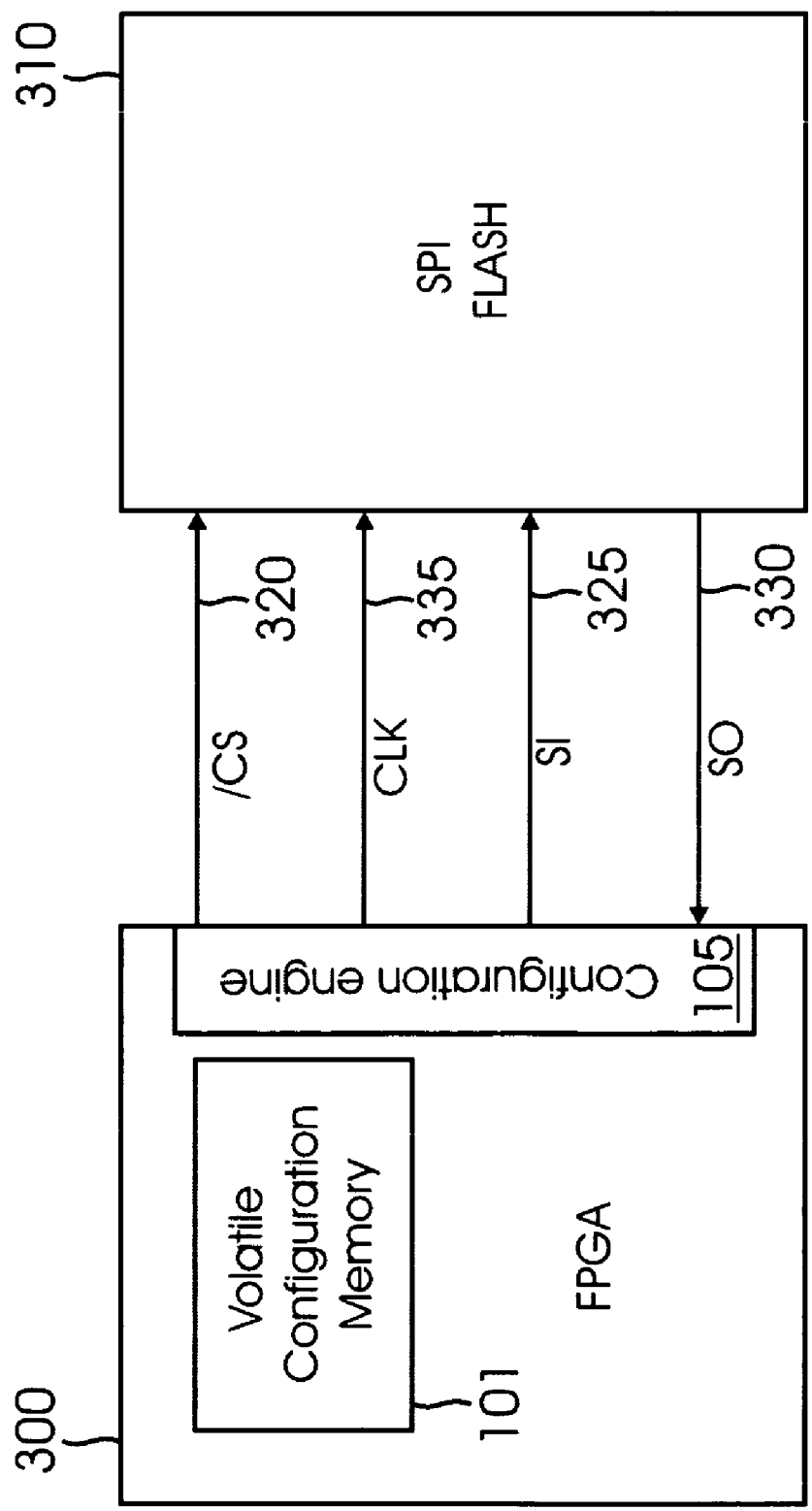
FIG. 3 is a block diagram of a programmable logic device operable to automatically detect and correct soft errors through reconfiguration from a non-volatile memory in accordance with an embodiment of the invention.

It will be appreciated that various types of programmable logic devices will benefit from the automatic soft error recovery circuits disclosed herein. For example, turning now to FIG. 3, an FPGA 300 is configured with a soft error detection circuit (not illustrated) and a configuration reset circuit (not illustrated). The soft error detection circuit continually calculates the current CRC for configuration memory 101. FPGA 300 includes configuration engine 105 that is adapted to retrieve configuration data from an external memory such as a serial peripheral interface (SPI) flash memory device 310 in response to an assertion of the soft error detection program signal (not illustrated) discussed with regard to FIG. 2.

In contrast to conventional configuration engines, configuration engine 105 is adapted to reconfigure the configuration memory while FPGA 300 continues normal operation. Such operation is not enabled by a conventional configuration engine, which is used during an initial configuration of a programmable logic device's configuration memory. Because the device is not operating during the initial configuration, a conventional configuration engine will typically clear the configuration memory and tri-state all input and output pins and/or pads on the device during configuration. In addition, a conventional configuration engine will typically prevent writes or reads to embedded memories during configuration. Moreover, a conventional configuration engine will assert a global reset signal that resets internal registers and other storage devices into known states.

Advantageously, configuration engine 105 may perform all such conventional configuration engine acts during an initial configuration. However, during a reconfiguration in response to the assertion of the soft error detection program signal, configuration engine 105 does not tri-state its pins, reset its registers, or prevent read/writes to embedded memories. In this fashion, normal operation may continue while the configuration memory is reconfigured. Background reconfiguration is possible in this fashion because, at any given time, most soft errors are innocuous one-bit events. Although a portion of the FPGA is not configured correctly due to such an error, that portion is only used at certain times or in response to certain events. In that regard, should a soft error affect the truth table of a lookup table that is currently being used to provide a necessary result, such an error will affect normal operation. However, such errors are infrequent. Thus, by adapting configuration engine 105 to operate as described above, soft errors may be corrected in the background such that their correction is completely transparent to a user. Indeed, a user would not be aware that a soft error has been corrected since normal operation has continued uninterrupted. As used herein, "normal operation" refers to the operation of a PLD after configuration has been completed.

The adaptation of a conventional configuration engine to form configuration engine 110 that enables background reconfiguration may implemented in a number of fashions. For example, referring again to FIG. 1, configuration engine 105 asserts a global reset signal 177 upon the initiation of a configuration cycle as known in the art. In a conventional configuration engine, global reset signal 177 is distributed to all internal registers (not illustrated) of the PLD. However, as seen in FIG. 1, global reset signal 177 is first filtered by a MUX 198 controlled by soft error detection flag 181. If a configuration cycle has been initiated by the assertion of flag 181, MUX 198 selects for a ground signal 197 to provide a filtered global reset signal 199. Filtered global reset signal 199 is distributed to all internal registers. However, if the soft error detection flag is asserted, none of the internal registers will be reset by filtered global reset signal 199 because MUX 198 is selecting for ground signal 197. It will be appreciated that rather than use a MUX to form filtered global reset signal 198, a register or other suitable blocking circuit could be used. Should a configuration cycle correspond to an initial configuration cycle, the soft error detection flag is not asserted. In such a case, MUX 198 selects for global reset signal 177 so that a global reset of all internal registers occurs in a conventional fashion. A similar processing (not illustrated) may be performed on the signals that control the tri-stating of outputs, enabling embedded memory writes, and clearing the configuration memory.

Referring again to FIG. 3, configuration engine 105 asserts chip select signal 320 in response to the assertion of the soft error detection program signal. The SPI flash memory will then respond to a read command and read address provided as a serial input (SI) signal 325 from the configuration engine. In turn, the SPI flash memory will provide the necessary configuration data as a serial output (SO) signal 330 in response to cycles of a read clock (CLK) 335. Advantageously, FPGA 300 can continue normal operation while the configuration data is re-loaded into the device. It will be appreciated that FPGA 300 could alternatively have included an internal non-volatile configuration memory. In such an embodiment, the configuration engine would be operable to retrieve the necessary configuration data from this internal non-volatile configuration memory rather than from an external memory as discussed with regard to FIG. 3.

Embodiments described above illustrate but do not limit the invention. For example, masked bits in the data shift register bit stream may be assigned to logical "ones" rather than logical zeroes as described above. Moreover, no limitations from the specification are intended to be read into any claims unless those limitations are expressly included in the claims. Accordingly, the scope of the invention is defined by the following claims.

We claim:

1. A programmable logic device, comprising:
    a configuration memory for storing configuration data;
    a configuration engine for configuring the configuration memory and retrieving resulting configuration data from the configuration memory;
    an error detection circuit for detecting whether the retrieved configuration data in the configuration memory has an error; and
    a configuration reset circuit for triggering the configuration engine to reconfigure the configuration memory if the error detection circuit detects the error,
    wherein the retrieved configuration data comprises programmed configuration data and non-programmed configuration data, and wherein the error detection circuit includes a first mode of operation in which both the programmed configuration data and the non-programmed configuration data are examined for error and includes a second mode of operation in which only the programmed configuration data is examined for error and the non-programmed configuration data is assigned to a known binary state.

2. The programmable logic device of claim 1, wherein the error detection circuit comprises a CRC calculation engine.

3. The programmable logic device of claim 2, wherein the CRC calculation engine comprises a linear feedback shift register (LFSR).

4. The programmable logic device of claim 1, wherein the configuration engine is adapted to allow reads or writes to at least one embedded memory in response to being triggered to reconfigure the configuration memory.

5. The programmable logic device of claim 1, wherein the configuration memory is a volatile configuration memory, and wherein the configuration engine is adapted to reconfigure the volatile configuration memory using a non-volatile configuration memory.

6. The programmable logic device of claim 5, wherein the programmable logic device incorporates the non-volatile configuration memory.

7. The programmable logic device of claim 5, wherein the non-volatile memory is an external SPI flash memory.

8. A programmable logic device, comprising:
    a configuration memory for storing configuration data;
    a configuration engine for configuring the configuration memory and retrieving resulting configuration data from the configuration memory;
    an error detection circuit for detecting whether the retrieved configuration data in the configuration memory has an error; and
    a configuration reset circuit for triggering the configuration engine to reconfigure the configuration memory if the error detection circuit detects the error,
    wherein the error detection circuit asserts an error detection flag if error is detected, and wherein the configuration reset circuit triggers the configuration engine in response to comparing the error detection flag with a delayed version of the error detection flag.

9. The programmable logic device of claim 8, wherein the configuration reset circuit comprises an AND gate to perform the comparison of the error detection flag with a delayed version of the error detection flag.

10. A programmable logic device, comprising:
    a configuration memory for storing configuration data;
    a configuration engine for configuring the configuration memory and retrieving resulting configuration data from the configuration memory;
    an error detection circuit for detecting whether the retrieved configuration data in the configuration memory has an error; and
    a configuration reset circuit for triggering the configuration engine to reconfigure the configuration memory if the error detection circuit detects the error,
    wherein the configuration engine is adapted to prevent a tri-state of any input or output pads in response to being triggered to reconfigure the configuration memory.

11. A programmable logic device, comprising:
    a configuration memory for storing configuration data;
    a configuration engine for configuring the configuration memory and retrieving resulting configuration data from the configuration memory;
    an error detection circuit for detecting whether the retrieved configuration data in the configuration memory has an error; and
    a configuration reset circuit for triggering the configuration engine to reconfigure the configuration memory if the error detection circuit detects the error,
    wherein the configuration engine is adapted to prevent an assertion of a global reset signal in response to being triggered to reconfigure the configuration memory.

12. A method of recovering from a soft error within configuration data stored in a configured programmable logic device, comprising:
    during operation of the configured programmable logic device, repeatedly processing the configuration data using an error-detection algorithm to generate a checksum;
    after a checksum is generated, comparing the generated checksum with a previously-generated checksum to determine if an error exists in the configuration data; and
    if an error is determined, initiating within the programmable logic device a reconfiguration of the configuration memory to remove the error from the configuration data,
    wherein the configuration data comprises programmed configuration data and non-programmed configuration data, the method further comprising assigning the non-programmed configuration data to a known binary state before processing the configuration data.

13. The method of claim 12, including reconfiguring the configuration memory without interrupting normal operation of the device.

14. The method of claim 12, wherein repeatedly processing the configuration data comprises using a CRC algorithm to generate a CRC checksum during each repetition, and comparing the generated checksum with a previously-generated checksum comprises comparing the generated CRC checksum with a previously-generated CRC checksum.

* * * * *

UNITED STATES PATENT AND TRADEMARK OFFICE
CERTIFICATE OF CORRECTION

PATENT NO.       : 7,596,744 B1                           Page 1 of 1
APPLICATION NO.  : 11/361584
DATED            : September 29, 2009
INVENTOR(S)      : Kow et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 838 days.

Signed and Sealed this

Twenty-eighth Day of September, 2010

David J. Kappos
*Director of the United States Patent and Trademark Office*